US008332725B2

(12) United States Patent
Weingarten

(10) Patent No.: US 8,332,725 B2
(45) Date of Patent: Dec. 11, 2012

(54) REPROGRAMMING NON VOLATILE MEMORY PORTIONS

(75) Inventor: Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 457 days.

(21) Appl. No.: 12/535,736

(22) Filed: Aug. 5, 2009

(65) Prior Publication Data

US 2010/0095186 A1    Apr. 15, 2010

Related U.S. Application Data

(60) Provisional application No. 61/136,234, filed on Aug. 20, 2008.

(51) Int. Cl.
*G11C 29/00* (2006.01)
*G11C 11/34* (2006.01)
*G11C 16/04* (2006.01)
*G11C 7/00* (2006.01)

(52) U.S. Cl. .................. 714/763; 365/200; 365/185.29; 365/185.3

(58) Field of Classification Search ........................ None
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A * | 9/1999 | Lee | 365/185.03 |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |

(Continued)

OTHER PUBLICATIONS

Search Report of PCT Patent Application WO 2009/118720 A3 dated Mar. 4, 2010.

(Continued)

*Primary Examiner* — Guerrier Merant
(74) *Attorney, Agent, or Firm* — SNR Denton US LLP

(57) ABSTRACT

A system and a method for reprogramming a non volatile memory (NVM) portion, the method includes: receiving an initial content of an NVM portion; wherein the initial content differs from an erase content of the NVM portion; processing the previously programmed content in response to input content that should be represented by an initial content of the NVM portion; wherein the processing is characterized by a write limitation that prevents a non-erase value of a bit to be changed to an erase value; wherein the processing comprises at least one out of skip value based encoding, generating error correction information and error correction code based encoding; and writing the processed content of the NVM portion to the NVM portion.

36 Claims, 9 Drawing Sheets

U.S. PATENT DOCUMENTS

| | | | | |
|---|---|---|---|---|
| 6,279,133 | B1 | 8/2001 | Vafai et al. | |
| 6,301,151 | B1 | 10/2001 | Engh et al. | |
| 6,370,061 | B1* | 4/2002 | Yachareni et al. | 365/185.22 |
| 6,374,383 | B1 | 4/2002 | Weng | |
| 6,504,891 | B1 | 1/2003 | Chevallier | |
| 6,532,169 | B1* | 3/2003 | Mann et al. | 365/185.08 |
| 6,532,556 | B1 | 3/2003 | Wong et al. | |
| 6,553,533 | B2 | 4/2003 | Demura et al. | |
| 6,560,747 | B1 | 5/2003 | Weng | |
| 6,637,002 | B1 | 10/2003 | Weng et al. | |
| 6,639,865 | B2 | 10/2003 | Kwon | |
| 6,674,665 | B1* | 1/2004 | Mann et al. | 365/185.08 |
| 6,704,902 | B1 | 3/2004 | Shinbashi et al. | |
| 6,751,766 | B2 | 6/2004 | Guterman et al. | |
| 6,772,274 | B1* | 8/2004 | Estakhri | 711/103 |
| 6,781,910 | B2 | 8/2004 | Smith | |
| 6,792,569 | B2 | 9/2004 | Cox et al. | |
| 6,873,543 | B2 | 3/2005 | Smith et al. | |
| 6,891,768 | B2 | 5/2005 | Smith et al. | |
| 6,914,809 | B2 | 7/2005 | Hilton et al. | |
| 6,915,477 | B2 | 7/2005 | Gollamudi et al. | |
| 6,952,365 | B2 | 10/2005 | Gonzalez et al. | |
| 6,961,890 | B2 | 11/2005 | Smith | |
| 6,990,012 | B2 | 1/2006 | Smith et al. | |
| 6,996,004 | B1 | 2/2006 | Fastow et al. | |
| 6,999,854 | B2 | 2/2006 | Roth | |
| 7,010,739 | B1 | 3/2006 | Feng et al. | |
| 7,012,835 | B2 | 3/2006 | Gonzalez et al. | |
| 7,038,950 | B1* | 5/2006 | Hamilton et al. | 365/185.28 |
| 7,068,539 | B2 | 6/2006 | Guterman et al. | |
| 7,079,436 | B2 | 7/2006 | Perner et al. | |
| 7,149,950 | B2 | 12/2006 | Spencer et al. | |
| 7,177,977 | B2 | 2/2007 | Chen et al. | |
| 7,191,379 | B2 | 3/2007 | Adelmann et al. | |
| 7,196,946 | B2 | 3/2007 | Chen et al. | |
| 7,203,874 | B2 | 4/2007 | Roohparvar | |
| 7,290,203 | B2 | 10/2007 | Emma et al. | |
| 7,292,365 | B2 | 11/2007 | Knox | |
| 7,301,928 | B2 | 11/2007 | Nakabayashi et al. | |
| 7,441,067 | B2* | 10/2008 | Gorobets et al. | 711/103 |
| 7,466,575 | B2 | 12/2008 | Shalvi et al. | |
| 7,533,328 | B2 | 5/2009 | Alrod et al. | |
| 7,558,109 | B2 | 7/2009 | Brandman et al. | |
| 7,593,263 | B2 | 9/2009 | Sokolov et al. | |
| 7,697,326 | B2 | 4/2010 | Sommer et al. | |
| 7,706,182 | B2 | 4/2010 | Shalvi et al. | |
| 7,804,718 | B2* | 9/2010 | Kim | 365/185.29 |
| 7,805,663 | B2 | 9/2010 | Brandman et al. | |
| 7,805,664 | B1 | 9/2010 | Yang et al. | |
| 7,844,877 | B2 | 11/2010 | Litsyn et al. | |
| 7,961,797 | B1 | 6/2011 | Yang et al. | |
| 8,020,073 | B2 | 9/2011 | Emma et al. | |
| 8,122,328 | B2 | 2/2012 | Liu et al. | |
| 2002/0063774 | A1 | 5/2002 | Hillis et al. | |
| 2002/0085419 | A1 | 7/2002 | Kwon et al. | |
| 2002/0154769 | A1 | 10/2002 | Petersen et al. | |
| 2003/0065876 | A1 | 4/2003 | Lasser | |
| 2003/0101404 | A1 | 5/2003 | Zhao et al. | |
| 2003/0105620 | A1 | 6/2003 | Bowen | |
| 2003/0192007 | A1 | 10/2003 | Miller et al. | |
| 2004/0015771 | A1 | 1/2004 | Lasser et al. | |
| 2004/0030971 | A1 | 2/2004 | Tanaka et al. | |
| 2004/0153722 | A1 | 8/2004 | Lee | |
| 2004/0153817 | A1 | 8/2004 | Norman et al. | |
| 2004/0181735 | A1 | 9/2004 | Xin | |
| 2005/0013165 | A1 | 1/2005 | Ban | |
| 2005/0018482 | A1 | 1/2005 | Cemea et al. | |
| 2005/0083735 | A1 | 4/2005 | Chen et al. | |
| 2005/0117401 | A1 | 6/2005 | Chen et al. | |
| 2005/0120265 | A1 | 6/2005 | Pline et al. | |
| 2005/0128811 | A1 | 6/2005 | Kato et al. | |
| 2005/0138533 | A1 | 6/2005 | Le Bars et al. | |
| 2005/0144213 | A1 | 6/2005 | Simkins et al. | |
| 2005/0144368 | A1 | 6/2005 | Chung et al. | |
| 2005/0169057 | A1 | 8/2005 | Shibata et al. | |
| 2005/0172179 | A1 | 8/2005 | Brandenberger et al. | |
| 2005/0213393 | A1 | 9/2005 | Lasser | |
| 2006/0059406 | A1 | 3/2006 | Micheloni et al. | |
| 2006/0059409 | A1 | 3/2006 | Lee | |
| 2006/0064537 | A1 | 3/2006 | Oshima et al. | |
| 2006/0101193 | A1 | 5/2006 | Murin | |
| 2006/0203587 | A1 | 9/2006 | Li et al. | |
| 2006/0221692 | A1 | 10/2006 | Chen | |
| 2006/0248434 | A1 | 11/2006 | Radke et al. | |
| 2006/0268608 | A1 | 11/2006 | Noguchi et al. | |
| 2006/0294312 | A1 | 12/2006 | Walmsley | |
| 2007/0025157 | A1 | 2/2007 | Wan et al. | |
| 2007/0063180 | A1 | 3/2007 | Asano et al. | |
| 2007/0103992 | A1 | 5/2007 | Sakui et al. | |
| 2007/0104004 | A1 | 5/2007 | So et al. | |
| 2007/0109858 | A1 | 5/2007 | Conley et al. | |
| 2007/0124652 | A1 | 5/2007 | Litsyn et al. | |
| 2007/0143561 | A1 | 6/2007 | Gorobets | |
| 2007/0150694 | A1 | 6/2007 | Chang et al. | |
| 2007/0168625 | A1 | 7/2007 | Cornwell et al. | |
| 2007/0171714 | A1 | 7/2007 | Wu et al. | |
| 2007/0171730 | A1 | 7/2007 | Ramamoorthy et al. | |
| 2007/0180346 | A1 | 8/2007 | Murin | |
| 2007/0223277 | A1 | 9/2007 | Tanaka et al. | |
| 2007/0226582 | A1 | 9/2007 | Tang et al. | |
| 2007/0226592 | A1 | 9/2007 | Radke | |
| 2007/0228449 | A1 | 10/2007 | Takano et al. | |
| 2007/0253249 | A1 | 11/2007 | Kang et al. | |
| 2007/0253250 | A1 | 11/2007 | Shibata et al. | |
| 2007/0263439 | A1 | 11/2007 | Cornwell et al. | |
| 2007/0266291 | A1 | 11/2007 | Toda et al. | |
| 2007/0271494 | A1 | 11/2007 | Gorobets | |
| 2008/0010581 | A1 | 1/2008 | Alrod et al. | |
| 2008/0028014 | A1 | 1/2008 | Hilt et al. | |
| 2008/0055989 | A1 | 3/2008 | Lee et al. | |
| 2008/0082897 | A1 | 4/2008 | Brandman et al. | |
| 2008/0092026 | A1 | 4/2008 | Brandman et al. | |
| 2008/0104309 | A1 | 5/2008 | Cheon et al. | |
| 2008/0116509 | A1 | 5/2008 | Harari et al. | |
| 2008/0126686 | A1 | 5/2008 | Sokolov et al. | |
| 2008/0127104 | A1 | 5/2008 | Li et al. | |
| 2008/0128790 | A1 | 6/2008 | Jung | |
| 2008/0130341 | A1 | 6/2008 | Shalvi et al. | |
| 2008/0137413 | A1 | 6/2008 | Kong et al. | |
| 2008/0148115 | A1 | 6/2008 | Sokolov et al. | |
| 2008/0158958 | A1 | 7/2008 | Sokolov et al. | |
| 2008/0159059 | A1 | 7/2008 | Moyer | |
| 2008/0162079 | A1 | 7/2008 | Astigarraga et al. | |
| 2008/0168216 | A1 | 7/2008 | Lee | |
| 2008/0168320 | A1 | 7/2008 | Cassuto et al. | |
| 2008/0181001 | A1 | 7/2008 | Shalvi | |
| 2008/0198650 | A1 | 8/2008 | Shalvi et al. | |
| 2008/0198652 | A1 | 8/2008 | Shalvi et al. | |
| 2008/0219050 | A1 | 9/2008 | Shalvi et al. | |
| 2008/0225599 | A1 | 9/2008 | Chae | |
| 2008/0263262 | A1 | 10/2008 | Sokolov et al. | |
| 2008/0282106 | A1 | 11/2008 | Shalvi et al. | |
| 2008/0285351 | A1 | 11/2008 | Shlick et al. | |
| 2008/0301532 | A1 | 12/2008 | Uchikawa et al. | |
| 2009/0024905 | A1 | 1/2009 | Shalvi et al. | |
| 2009/0043951 | A1 | 2/2009 | Shalvi et al. | |
| 2009/0072303 | A9 | 3/2009 | Prall et al. | |
| 2009/0091979 | A1 | 4/2009 | Shalvi | |
| 2009/0103358 | A1 | 4/2009 | Sommer et al. | |
| 2009/0106485 | A1 | 4/2009 | Anholt | |
| 2009/0113275 | A1 | 4/2009 | Chen et al. | |
| 2009/0125671 | A1 | 5/2009 | Flynn et al. | |
| 2009/0144600 | A1 | 6/2009 | Perlmutter et al. | |
| 2009/0150748 | A1 | 6/2009 | Egner et al. | |
| 2009/0157964 | A1 | 6/2009 | Kasorla et al. | |
| 2009/0158126 | A1 | 6/2009 | Perlmutter et al. | |
| 2009/0168524 | A1 | 7/2009 | Golov et al. | |
| 2009/0187803 | A1 | 7/2009 | Anholt et al. | |
| 2009/0199074 | A1 | 8/2009 | Sommer | |
| 2009/0213653 | A1 | 8/2009 | Perlmutter et al. | |
| 2009/0213654 | A1 | 8/2009 | Perlmutter et al. | |
| 2009/0228761 | A1 | 9/2009 | Perlmutter et al. | |
| 2009/0240872 | A1 | 9/2009 | Perlmutter et al. | |
| 2010/0005270 | A1 | 1/2010 | Jiang | |
| 2010/0058146 | A1 | 3/2010 | Weingarten et al. | |
| 2010/0064096 | A1 | 3/2010 | Weingarten et al. | |
| 2010/0088557 | A1 | 4/2010 | Weingarten et al. | |

| | | |
|---|---|---|
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/095902 A3 dated Mar. 4, 2010.

Search Report of PCT Patent Application WO 2009/078006 A3 dated Mar. 4, 2010.

Search Report of PCT Patent Application WO 2009/074979 A3 dated Mar. 4, 2010.

Search Report of PCT Patent Application WO 2009/074978 A3 dated Mar. 4, 2010.

Search Report of PCT Patent Application WO 2009/072105 A3 dated Mar. 4, 2010.

Search Report of PCT Patent Application WO 2009/072104 A3 dated Mar. 4, 2010.

Search Report of PCT Patent Application WO 2009/072103 A3 dated Mar. 4, 2010.

Search Report of PCT Patent Application WO 2009/072102 A3 dated Mar. 4, 2010.

Search Report of PCT Patent Application WO 2009/072101 A3 dated Mar. 4, 2010.

Search Report of PCT Patent Application WO 2009/072100 A3 dated Mar. 4, 2010.

Search Report of PCT Patent Application WO 2009/053963 A3 dated Mar. 4, 2010.

Search Report of PCT Patent Application WO 2009/053962 A3 dated Mar. 4, 2010.

Search Report of PCT Patent Application WO 2009/053961 A3 dated Mar. 4, 2010.

Search Report of PCT Patent Application WO 2009/037697 A3 dated Mar. 4, 2010.

Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.

Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.

Michael Purser, "Introduction to Error Correcting Codes", Artech House Inc., 1995.

Ron M. Roth, "Introduction to Coding Theory", Cambridge University Press, 2006.

Akash Kumar, Sergei Sawitzki, "High-Throughput and Low Power Architectures for Reed Solomon Decoder", (a.kumar at tue.nl, Eindhoven University of Technology and sergei.sawitzki at philips.com).

Todd K.Moon, "Error Correction Coding Mathematical Methods and Algorithms", A John Wiley & Sons, Inc., 2005.

Richard E. Blahut, "Algebraic Codes for Data Transmission", Cambridge University Press, 2003.

David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.

Giovanni Campardo, Rino Micheloni, David Novosel, "VLSI-Design of Non-Volatile Memories", Springer Berlin Heidelberg New York, 2005.

John G. Proakis, "Digital Communications", 3rd ed., New York: McGraw-Hill, 1995.

J.M. Portal, H. Aziza, D. Nee, "EEPROM Memory: Threshold Voltage Built in Self Diagnosis", ITC International Test Conference, Paper 2.1.

J.M. Portal, H. Aziza, D. Nee, "EEPROM Diagnosis Based on Threshold Voltage Embedded Measurement", Journal of Electronic Testing: Theory and Applications 21, 33-42, 2005.

G. Tao, A. Scarpa, J. Dijkstra, W. Stidl, F. Kuper, "Data retention prediction for modern floating gate non-volatile memories", Microelectronics Reliability 40 (2000), 1561-1566.

T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.

Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.

Paulo Cappelletti, Clara Golla, Piero Olivo, Enrico Zanoni, "Flash Memories", Kluwer Academic Publishers, 1999.

JEDEC Standard, "Stress-Test-Driven Qualification of Integrated Circuits", JEDEC Solid State Technology Association. JEDEC Standard No. 47F pp. 1-26.

Dempster, et al., "Maximum Likelihood from Incomplete Data via the EM Algorithm", Journal of the Royal Statistical Society. Series B (Methodological), vol. 39, No. 1 (1997), pp. 1-38.

Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.

Daneshbeh, "Bit Serial Systolic Architectures for Multiplicative Inversion and Division over GF (2)", A thesis presented to the University of Waterloo, Ontario, Canada, 2005, pp. 1-118.

Chen, Formulas for the solutions of Quadratic Equations over GF (2), IEEE Trans. Inform. Theory, vol. IT- 28, No. 5, Sep. 1982, pp. 792-794.

Berlekamp et al., "On the Solution of Algebraic Equations over Finite Fields", Inform. Cont. 10, Oct. 1967, pp. 553-564.

* cited by examiner

REPROGRAMMING NON VOLATILE MEMORY PORTIONS

RELATED APPLICATIONS

This application claims priority from U.S. provisional patent application 61/136,234, dated Aug. 20, 2008 and titled "A Method Of Reprogramming A Non-Volatile Memory Device Without Performing An Erase Operation", the entire contents of which are incorporated herein by reference.

FIELD OF THE INVENTION

The invention relates to field of non volatile memories and especially to reprogramming content of NVM portions without performing an erase operation.

BACKGROUND OF THE INVENTION

Today's Flash memory devices store information with high density on Flash cells with ever smaller dimensions. In addition, Multi-Level Cells (MLC) store several bits per cell by setting the amount of charge in the cell. The amount of charge is then measured by a detector, as measured by a threshold voltage of the transistor gate denoted by VT. Due to inaccuracies during the programming procedure and charge loss due to time and temperature (also known as retention), the measured levels during a Read operation suffers from detection errors. The small dimensions of the Flash cells result in cells that can store very small amounts of charge, enhancing the effects of inaccuracies due to programming and retention. Thus, new single level cells (SLC) and MLC (two or more bits per cell) devices have significantly increased bit error rate (BER), decreasing the reliability of the device.

Flash devices are organized into (physical) pages. Each page contains a section allocated for data (512 bytes-8 Kbytes) and a small amount of spare bytes (16-32 bytes for every 512 data bytes) containing redundancy and back pointers. The redundancy bytes are used to store error correcting information, for correcting errors which may have occurred during the page Read. Each Read and Program operation is performed on an entire page. A number of pages are grouped together to form an Erase Block (EB). A page cannot be erased unless the entire EB which contains it is erased.

An important measure of a Flash device quality is the number of times (Np) it may be reprogrammed and the period that it can store information (usually 10 years) before irrecoverable errors occur. The higher the number of program-erase cycles, the higher the BER. Thus, today's MLC with 2 bits per cell devices can perform around Np=10,000 cycles and 10 years retention before the allocation of 16 bytes of redundancy per 512 bytes of data bytes becomes insufficient to correct errors. SLC devices usually perform better but obtain a much lower density and hence their prices are much higher. Note that following Np program-erase cycles the device is still operational but the BER is higher.

One factor that increases the number of cycles is the fact that an entire block must be erased at once. For example, when a single page of a programmed block is to be modified, in many cases (e.g. SD cards and USB drives), the programmed block is copied to an erased block and the relevant page is replaced in the process. Thus, a single page change requires the programming of an entire block and an erasure of a block. This process is usually referred to as a read modify write operation.

SUMMARY OF THE INVENTION

A method for reprogramming a non volatile memory (NVM) portion, the method includes: receiving an initial content of an NVM portion; wherein the initial content differs from an erase content of the NVM portion; processing the previously programmed content in response to input content that should be represented by an initial content of the NVM portion; wherein the processing is characterized by a write limitation that prevents a non-erase value of a bit to be changed to an erase value; wherein the processing comprises at least one out of skip value based encoding, generating error correction information and error correction code based encoding; and writing the processed content of the NVM portion to the NVM portion.

A system that has non volatile memory (NVM) portion reprogramming capabilities, the system includes: an NVM unit; a random access memory (RAM) unit for receiving an initial content of an NVM portion; wherein the initial content differs from an erase content of the NVM portion; a processor for processing the initial content in response to input content that should be represented by an initial content of the NVM portion; wherein the processing is characterized by a write limitation that prevents a non-erase value of a bit to be changed to an erase value; wherein the processor comprises at least one out of a skip value based encoder, error correction information generator and error correction code based encoder; and an interface for writing the processed content of the NVM portion to the NVM portion.

BRIEF DESCRIPTION OF THE DRAWINGS

Further details, aspects, and embodiments of the invention will be described, by way of example only, with reference to the drawings.

DETAILED DESCRIPTION OF THE DRAWINGS

Figure 1:
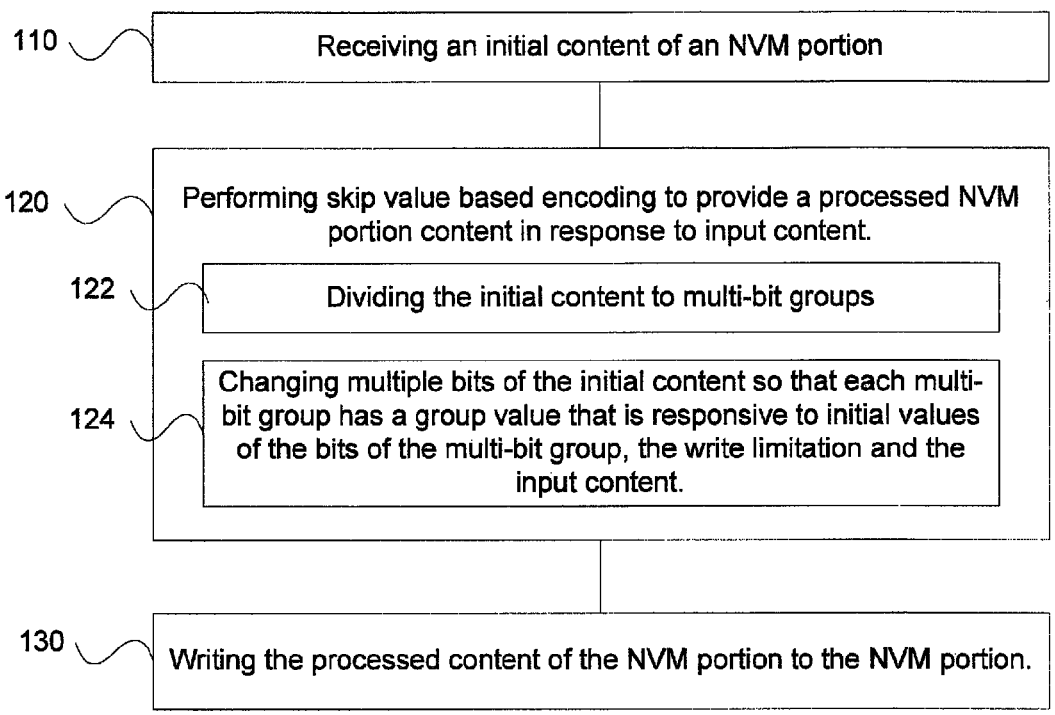
FIG. 1 illustrates a method for skip value based encoding according to an embodiment of the invention.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The following terms may be construed either in accordance with any definition thereof appearing in the prior art literature or in accordance with the specification, or as follows:

Bit error rate (BER)=a parameter that a flash memory device manufacturer commits to vis a vis its customers, expressing the maximum proportion of wrongly read bits (wrongly read bits/total number of bits) that users of the flash memory device need to expect at any time during the stipulated lifetime of the flash memory device e.g. 10 years.

Cell: A component of flash memory that stores one bit of information (in single-level cell devices) or n bits of information (in a multi-level device having $2^n$ levels). Typically, each cell includes a floating-gate transistor. The variable n may or may not be an integer.

"Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Digital value or "logical value": n-tuple of bits represented by a cell in flash memory capable of generating $2^n$ distinguishable levels of a typically continuous physical value such as charge, where n may or may not be an integer. Typically, in a one-bit cell a low physical value is associated with a high logical value and a high physical value is associated with a low logical value. Typically, in a two-bit cells a "11" physical value is associated with a "0" logical value, a "01" physical value is associated with a "1" logical value, a "10" physical value is associated with a "2" logical value, and a "00" physical value is associated with a "3" logical value.

Flash memory: A non volatile memory (NVM) that includes cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Logical page: a portion of typically sequential data, whose amount is typically less than or equal to a predetermined amount of data defined to be a page full of data, which has typically been defined by a host (data source/destination) or user thereof, as a page, and which is sent by the host to a flash memory device for storage and is subsequently read by the host from the flash memory device.

Physical Page: A portion, typically 512 or 2048 or 4096 bytes in size, of a flash memory e.g. a NAND or NOR flash memory device. Writing and reading is typically performed physical page by physical page, as opposed to erasing which can be performed only erase sector by erase sector. A few bytes, typically 16-32 for every 512 data bytes are associated with each page), for storage of error correction information. A typical block may include 32 512-byte pages or 64 2048-byte pages. Alternatively, a physical page is an ordered set (e.g. sequence or array) of flash memory cells which are all written in simultaneously by each write operation. The set typically includes a predetermined number of typically physically adjacent flash memory cells containing actual data written by the host and subsequently read by the host, as well as, typically error correction information and back pointers used for recognizing the true address of a page.

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Data cells: cells storing data provided by host as opposed to "non-data cells" which do not store host-provided data, and may, for example, store instead error correction information, management information, redundancy information, spare bits or parity bits.

NVM portion: a portion of an NVM unit. The portion can include one or more pages, a part of a page, and the like. A portion can be smaller than an erase block but this is not necessarily so.

Initial content: content of an NVM portion before being processed. The initial content can be generated by programming an NVM portion.

Error correction code based encoding: an encoding process that generates content representative of an input content by applying error correction information generation techniques.

Skip value based encoding: an encoding process during which an initial Content of a NVM portion is partitioned to multi-bit groups and each multi-bit group can be programmed to have a group value. One group value can be a skip value that indicates that this multi-bit group should be skipped (ignored) during the decoding process.

Various method and systems are provided. These systems and methods operate under a write limitation that prevents a non-erase value of a bit to be changed to an erase value. In MLC devices the physical values of the cell can be decreased and not increased—the logical values can be increased and not decreased. Accordingly, a content of an NVM portion can be reprogrammed without being erased.

An initial content of an NVM portion can be processed during skip value based encoding, generation of error correction information and error correction based encoding.

The processing can involve programming a Flash page even though it has been previously programmed and not yet erased. Thus, reducing the number of erase cycles and the number of read modify write operations required when a single page is modified within a program block. It is noted that the number of programmed bits, in the following programming iterations, is smaller than that programmed to the page just following the erase operation.

The processing involves programming Flash cells to lower physical logical levels. That is, if the Flash device is an SLC, then it is assumed that an erased cell ('1') can be programmed to a '0' state but that a '0' state may not be programmed back to an erased state unless the entire block has been previously erased.

Skip Value Based Encoding

FIG. 1 illustrates method 100 of skip value based encoding according to an embodiment of the invention.

Method 100 performs skip value based encoding. Method 100 is aimed to program an NVM portion to store information representative of an input content (also referred to as a desired content).

Method 100 starts by stage 110 of receiving an initial content of an NVM portion. The initial content differs from an erase content of the NVM portion. Stage 110 can include copying to a memory unit such as a RAM unit a content of a page of an NVM unit. The initial content is a result of one or more programming cycles that follow an erase operation. Accordingly, some NVM portion content bits are '0' while other NVM portion content bits are '1'.

Stage 110 is followed by stage 120 of performing skip value based encoding to provide a processed NVM portion content in response to input content. The processed NVM portion represents the input content. The skip value based encoding is characterized by a write limitation that prevents a non-erase value of a bit to be changed to an erase value.

Stage 120 is followed by stage 130 of writing the processed content of the NVM portion to the NVM portion.

Stage 120 includes stage 122 of dividing the initial content to multi-bit groups and stage 124 of changing multiple bits of the initial content so that each multi-bit group has a group value that is responsive to initial values of the bits of the multi-bit group, the write limitation and the input content. The group values are selected from a skip value and at least one data value.

Stage 124 includes searching, for each input content bit that has an erase value, for a multi-bit group that includes only bits that their initial value equals an erase value and writing a skip value to a multi-bit group that was evaluated during the searching and comprises at least one bit that has an initial value that differs from an erase value.

The multi-bit group can include two or more bits.

The following example illustrates various stages of method 100 assuming that each multi-bit group includes 2 bits. Table 1 illustrates a mapping between values of pair of NVM portion content bits and group values. There are t pairs of NVM portion content bits (denoted Y(j)) in the initial content and the initial content X(i) includes k values—index i ranges between 0 and (k−1). The value of t is much larger than k in order to allow the representation of the initial content—as the initial value of the NVM portion is not known in advance and can include much more non-programmable ('0') bits than programmable ('1') bits.

TABLE 1

| Pair of NVM portion content bits | Group value |
| --- | --- |
| 11 | 1 |
| 01 | 0 |
| 10 | 0 |
| 00 | Skip |

Figure 2:
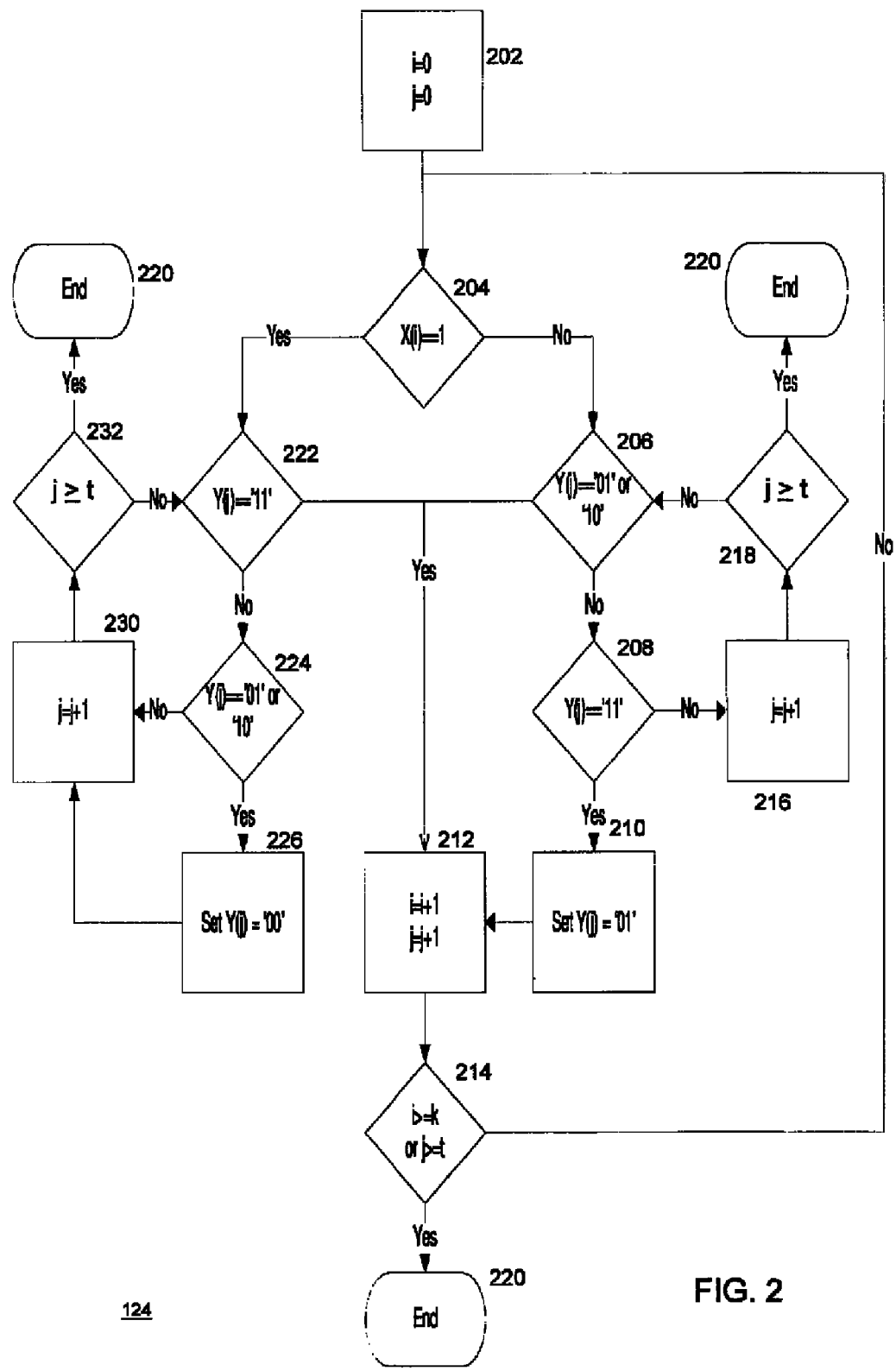
FIG. 2 illustrates a stage of the method of FIG. 1 according to an embodiment of the invention.

FIG. 2 illustrates stage 124 according to an embodiment of the invention.

Stage 124 includes stages 202-232. Table 2 illustrates these stages.

TABLE 2

| Stage number and description | Next stage | Next stage if answer is positive | Next stage if answer is negative |
| --- | --- | --- | --- |
| 202 - resetting indexes i and j | 204 | | |
| 204 - checking if X(i) equals '1' | | 222 | 206 |
| 206 - check if Y(j) equals '01' or '10' | | 212 | 208 |
| 208 - check if Y(j) equals '11' | | 210 | 216 |
| 210 - set Y(j) to '01' | 212 | | |
| 212 - increase indexes i and j by one | 214 | | |
| 214 - check if the iteration should end - if index I reaches k or if index j reaches t | | 220 | 204 |
| 216 - increase j | 218 | | |
| 218 - check if j reaches t | | 220 | 206 |
| 220 - END | | | |
| 222 - check if Y(j) equals '11' | | 212 | 224 |
| 224 - check if Y(j) equals '01' or '10' | | 226 | 230 |
| 226 - set Y(j) to '00' | 230 | | |
| 230 - increase j | 232 | | |
| 232 - check if j reaches t | | 220 | 222 |

Accordingly, stage 124 starts by initializing indexes i and j which point to the bit of the input content to be encoded (X(i)) and the pair of NVM portion content bits (Y(j)), respectively.

If X(i) equals '1' then the method checks whether the j'th pair, Y(j), is already '11'. If it is not, its value is changed to have a skip value ('00' state) if necessary. Index j is increased and these stages are repeated until finding a pair which is a '11'. Once such a pair was found, the method can continue to encode the next input content bit. Accordingly, index i and j are increased.

If X(i)=0, then the method searches for a pair of Y(j) that equals '01' or '10'. If it is so, then both index i and j are increased and the method starts to encode the next bit. If not, the method checks if Y(j)='11'. If it is so, it should be modified to '01'. Then the method increases both index i and j and turns to encode the next bit in line. If Y(j) is neither '01', '10' nor '11' (i.e. it is '00') then the method increases index j until it finds a pair which is not a '00'. This process ends when either j>=t or when i>=k. Once this process is completed, the entire vector Y is programmed into the Flash.

Note that, in theory, we may encounter a case where we go through all the pairs before we encode all our bits. I.e. we reach j=t before i=k. We shall call this an encoding failure. Therefore, k is selected to be small enough such that this occurrence will be negligible. Assuming that the NVM page was originally programmed with random data, each pair in Y is equally probable. Therefore, when X(i)=1, it would take on average 4 couples to encode that bit (as only 1 in 4 couples is a '11'). On the other hand, if X(i)=0, it would only require 4/3 couples on average to encode this bit (as only a '00' would prevent encoding in the current location). Therefore, it is possible to show that for a page of 512 bytes, one could encode k=512*8/3 bits with a probability of failure below 1E-3. By encoding k=512*8/3.5 bits, this probability goes even further down to less than 1E-20.

Figure 3:
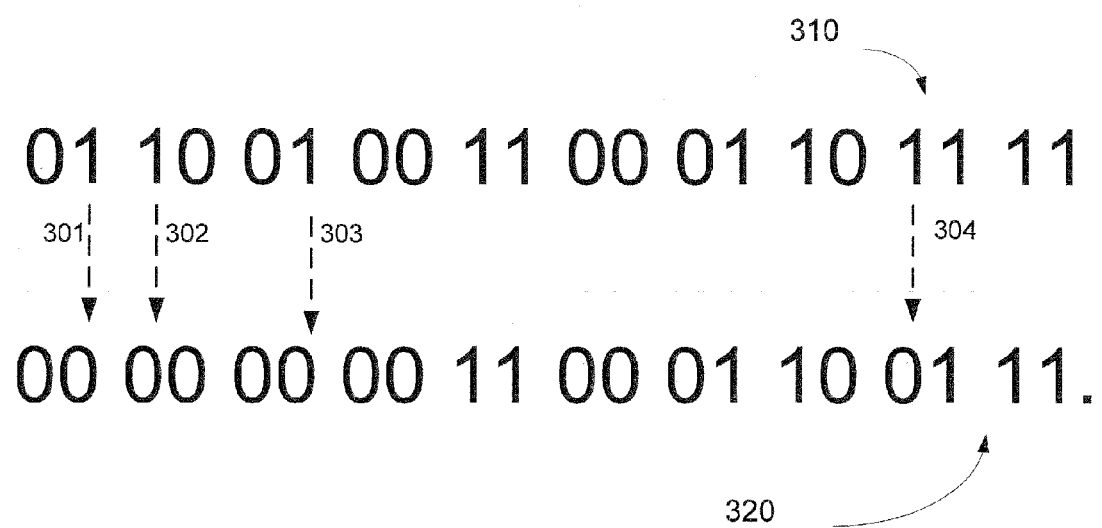
FIG. 3 shows an example of an initial NVM portion content and a processed NVM content according to an embodiment of the invention.

FIG. 3 shows an example of ten pairs of NVM portion content bits 310 that had an initial value of Y(j)=01 10 01 00 11 00 01 10 11 11 and were reprogrammed to encode input content X(i)=10001.

X(0) equals "1". Y(0)='01', Y(1)='10 ', Y(2)='01', Y(3)='00 ', and Y(4)='11'. Accordingly, Y(0), Y(1) and Y(2) were reprogrammed to a skip value ('00'). Y(3) remains '00' and Y(4) remains '11' and represents X(0).

X(1) equals "0". Y(5)='00', Y(6)='01'. Accordingly, Y(5) remains '00' and Y(6) represents X(1).

X(2) equals "0". Y(7)='10'. Accordingly, Y(7) represents X(2).

X(3) equals "0". Y(8)='11'. Accordingly, Y(8) is reprogrammed by resetting one of its bits to be '01' and to represent X(3).

X(4) equals "1". Y(9)='11'. Accordingly, Y(9) represents X(4).

The processed value of Y(j) is denoted 320 and equals 00 00 00 00 11 00 01 10 01 11. The dashed arrows 301, 302 and 303 illustrate the change of bit values.

Figure 4:
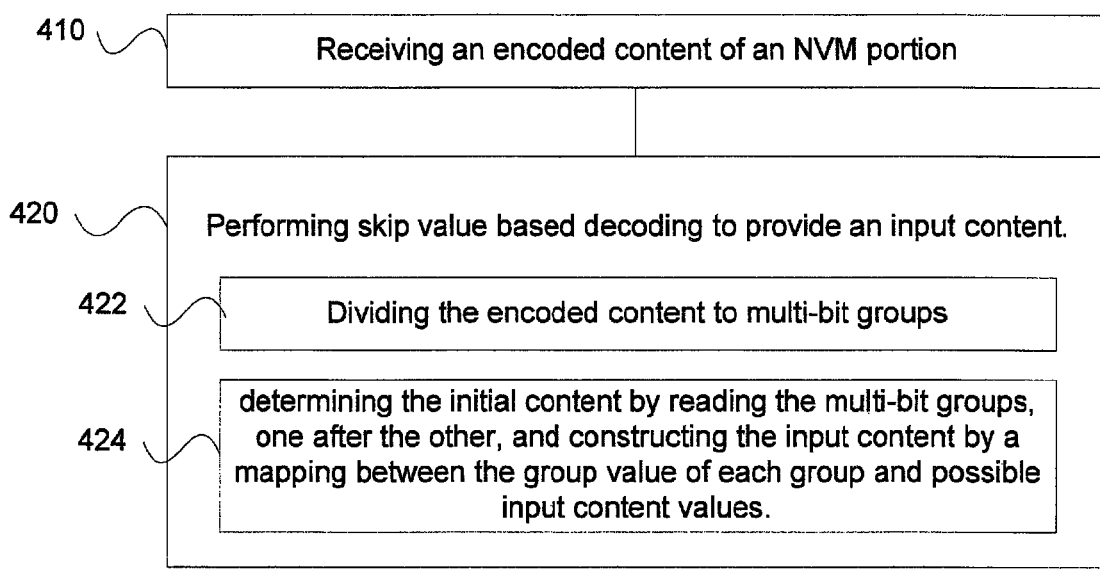
FIG. 4 illustrates a method for performing skip value based decoding according to an embodiment of the invention.

FIG. 4 illustrates method 400 for performing skip value based decoding according to an embodiment of the invention.

Method 400 performs skip value based decoding. Method 400 is aimed to decode a content of an NVM portion in order to reveal the input content.

Method 400 starts by stage 410 of receiving an encoded content of an NVM portion. Stage 410 can include copying to a memory unit, such as a RAM unit, a content of a page of an NVM unit.

Stage 410 is followed by stage 420 of performing skip value based decoding to provide an input content.

Stage 420 includes stage 422 of dividing the encoded content to multi-bit groups and stage 424 of determining the initial content by reading the multi-bit groups, one after the other, and constructing the input content by a mapping (such as the mapping illustrated in table 1) between the group value of each group and possible input content values. Accordingly, multi-bit groups that store a skip value are ignored.

Figure 5:
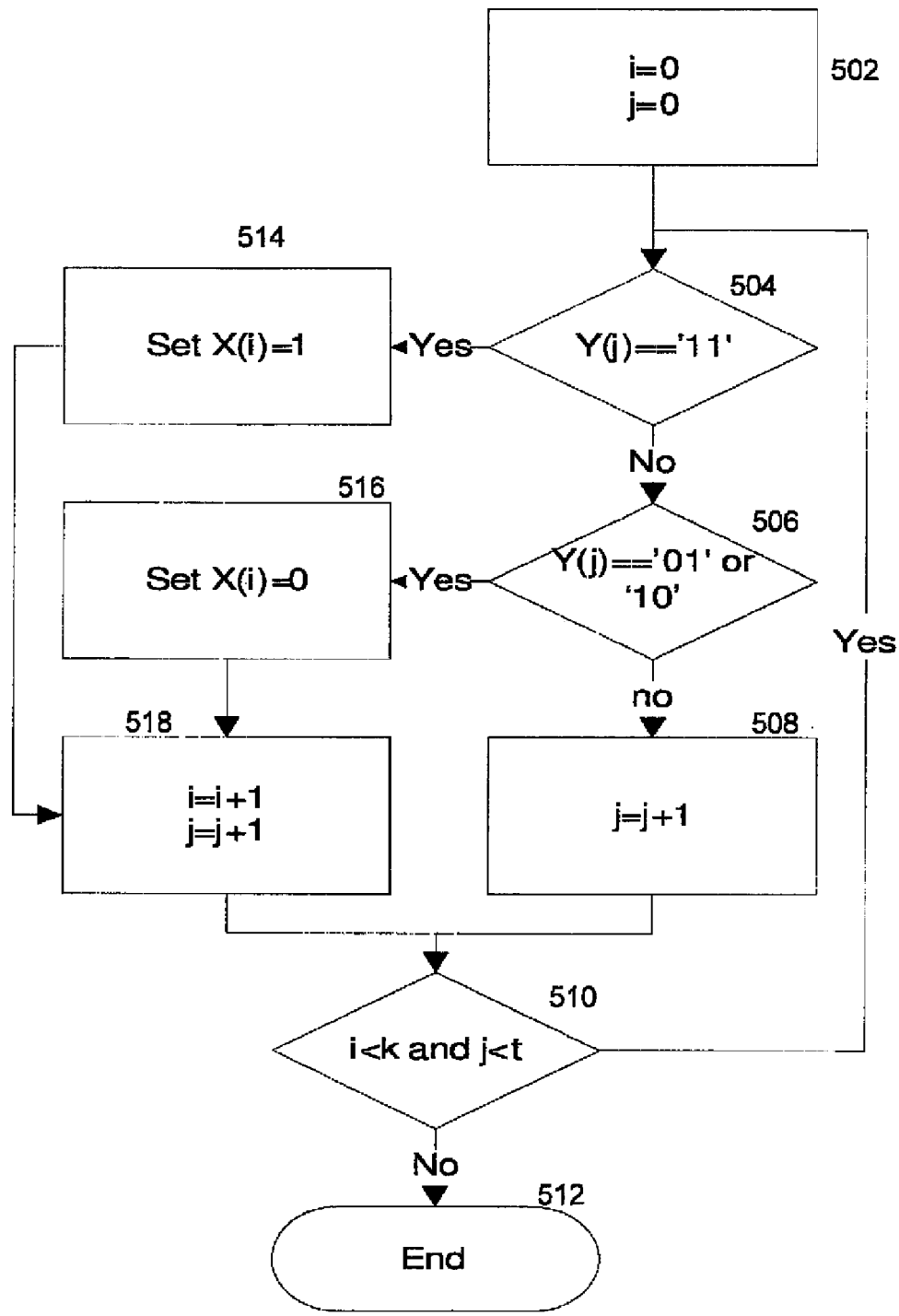
FIG. 5 illustrates a stage of the method of FIG. 4 according to an embodiment of the invention.

FIG. 5 illustrates stage 424 of determining the initial content according to an embodiment of the invention.

Stage 424 includes stages 502-522. Table 3 illustrates these stages.

TABLE 3

| Stage number and description | Next stage | Next stage if answer is positive | Next stage if answer is negative |
| --- | --- | --- | --- |
| 502 - resetting indexes i and j | 504 | | |
| 504 - checking if Y(j) equals '11' | | 514 | 506 |
| 506 - check if Y(j) equals '01' or '10' | | 516 | 508 |
| 508 - increase j by one | 510 | | |
| 510 - check if the iteration should end - if index l reaches k or if index j reaches t | | 512 | 504 |
| 512 - END | | | |
| 514 - set X(j) to 1 | 518 | | |
| 516 - set X(j) to 0 | 518 | | |
| 518 - increase l and j by one | 510 | | |

Stage 424 starts by setting i=0, j=0. If Y(j)=='11' then the method sets X(i)='1'. If Y(j)=='01' or '10', the method resets X(i)='0'. In both cases the method increments i and j. On the other hand if Y(j)=='00', the current pair is skipped (ignored) by incrementing only j. This is repeated as long as i<k and j<t. If at the end of the procedure i was smaller than k, the method declares a failure. The failure can be detected both at the programming stage and the decoding stage.

Generating Error Correction Information

Beyond encoding-failures reading the NVM portion can be characterized by read errors in which a bit may be incorrectly read from the page. In order to minimize the probability of this occurring, error correction information can be generated. The error correction information can be generated at a page level but this is not necessarily so.

In order to generate error correction information an NVM portion should be allocated. It should be large enough to guarantee that despite the unknown initial content of that portion and despite the writing limitation that the error correction information can be properly written. This NVM portion is referred to as a second NVM portion while the NVM portion that stores the error correction protected content is referred to as a first NVM portion.

Figure 6:
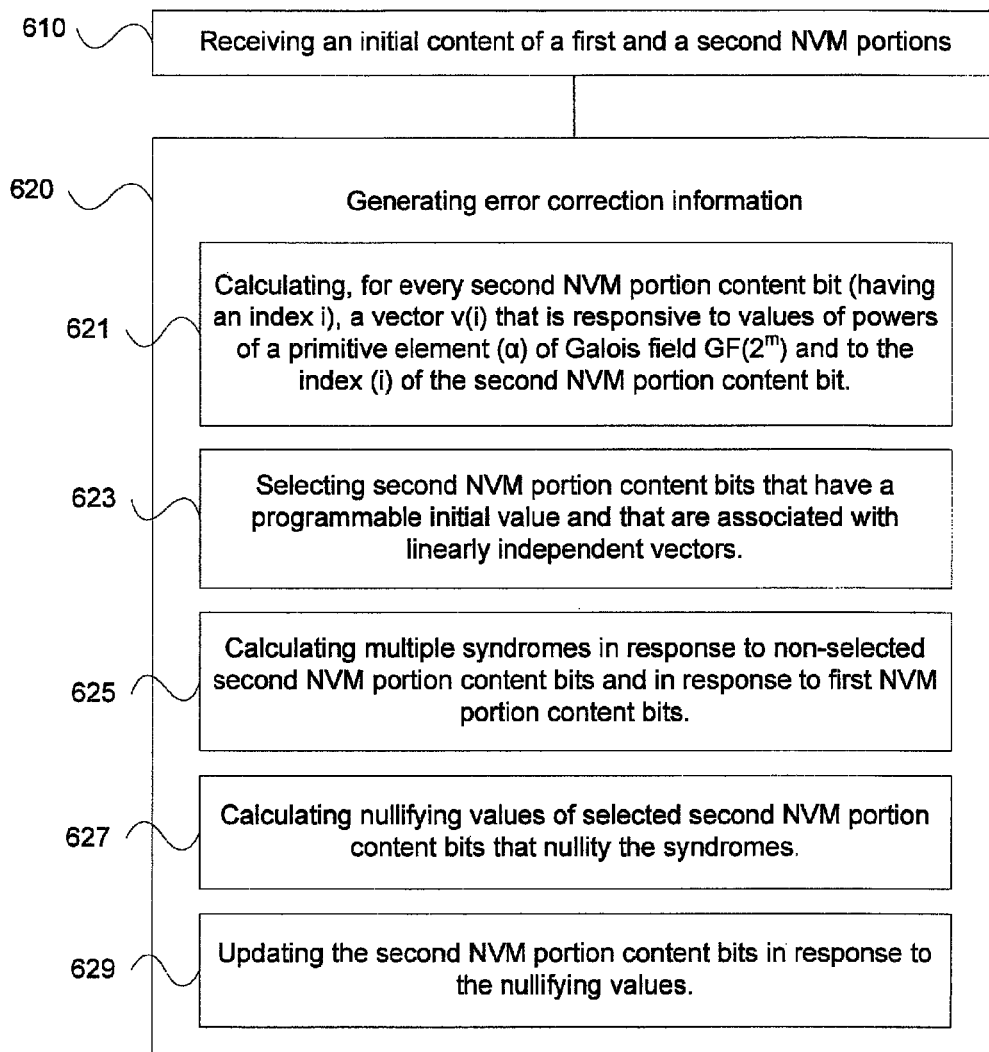
FIG. 6 illustrates a method for generating error correction information according to an embodiment of the invention.

FIG. 6 illustrates method 600 for generating error correction information according to an embodiment of the invention.

Method 600 can be applied on an encoded content of an NVM portion (it can, for example, follow method 100 of skip value based encoding) but this is not necessarily so. For simplicity of explanation it is assumed that the error correction information protects an initial content of a first NVM portion.

Method 600 starts by stage 610 of receiving an initial content of a first and a second NVM portions. The initial content of these NVM portions differs from an erase content of these NVM portion. Stage 610 can include copying to a memory unit such as a RAM unit a content of a page of an NVM unit—the page includes the first and second NVM portions. The initial content of each NVM portion is a result or one or more programming cycles that follows an erase operation. The content of the first NVM portion can be a result of a skip value based encoding process. Accordingly, some first and second NVM portions content bits are '0' while other first and second NVM portions content bits are '1'.

Stage 610 is followed by stage 620 of generating error correction information. The generating of error correction information is characterized by a write limitation that prevents a non-erase value of a bit to be changed to an erase value.

Stage 620 can include at least one of stages 621, 623, 625, 627 and 629.

The first NVM portion includes r bits and the combination of the first and second NVM portions includes n bits.

A code is designed over a Gloais field $\{GF(2^m)\}$ where $2^m > n$. $\alpha \in GF(2^m)$ denotes the primitive element used in the error correction encoding and decoding process. Variable e indicates the number of errors that can be corrected by a codeword while m is the length of the codeword.

Stage 621 includes calculating, for every second NVM portion content bit (having an index i), a vector v(i) that is responsive to values of powers of a primitive element (a) of Galois field $GF(2^m)$ and to the index (i) of the second NVM portion content bit.

The vectors v(i) are defined by bit representation of the vector $$v(i) = \begin{pmatrix} \alpha^{i \cdot (2 \cdot 0 + 1)} \\ \alpha^{i \cdot (2 \cdot e - 1)} \end{pmatrix}$$

Stage 623 includes selecting second NVM portion content bits that have a programmable initial value and that are associated with linearly independent vectors.

It is noted that around half of the second NVM portion content bits are non-programmable ('0'). Furthermore, of the half of the programmable second NVM portion content bits there is a linear dependency between their corresponding vectors v(i). Conveniently, only second NVM portion content bits that have a programmable initial values and that are associated with linearly independent vectors should be selected. There are m*e such bits and their indexes are denoted $i_1, i_2, \ldots i_{m*e}$.

Stage 625 includes calculating multiple syndromes in response to non-selected second NVM portion content bits and in response to first NVM portion content bits. Stage 625 can include calculating the syndromes by:

$$S_j = \sum_{\substack{i \neq i_1, i_2, \ldots, i_{me} \\ i=1 \ldots n}} \alpha^{i(2j+1)}$$

Stage 627 includes calculating nullifying values of selected second NVM portion content bits that nullity the syndromes.

Stage 627 can include calculating the nullifying values of the selected second NVM portion content bits by computing $$\begin{pmatrix} \alpha^{0 \cdot i_1} & & \alpha^{0 \cdot i_{m \cdot e}} \\ & \ddots & \\ \alpha^{(e-1) \cdot i_1} & & \alpha^{(e-1) \cdot i_{m \cdot e}} \end{pmatrix}^{-1} S =$$

$$B = (v(i_1) \ldots v(i_{me}))^{-1} S$$

where S is the bit representation of $$\begin{pmatrix} S_0 \\ S_{e-1} \end{pmatrix}.$$

The vector B can be programmed into the second NVM portion as its bits are associated only with programmable bits. Furthermore, B exist since its bits are associated with linearly independent vectors v(i).

Stage 629 includes updating the second NVM portion content bits in response to the nullifying values.

It is noted that r>m*e. index e represents the maximal number of errors that can be corrected by the error correction information. For example, a first NVM portion of 512 bytes, where e=4 and m=13 requires r=40 bytes to ensure that indeed the r bit sequence will satisfy the conditions with a failure probability less than 1 E-20.

It is noted that after method 600 ends the first and second NVM portions contents can be read, an error correction process can be applied (for example—by a BCH decoder), error (if found) can be corrected and then an error corrected first NVM content can be decoded to reveal the initial content.

Error Correction Code Based Encoding

Figure 7:
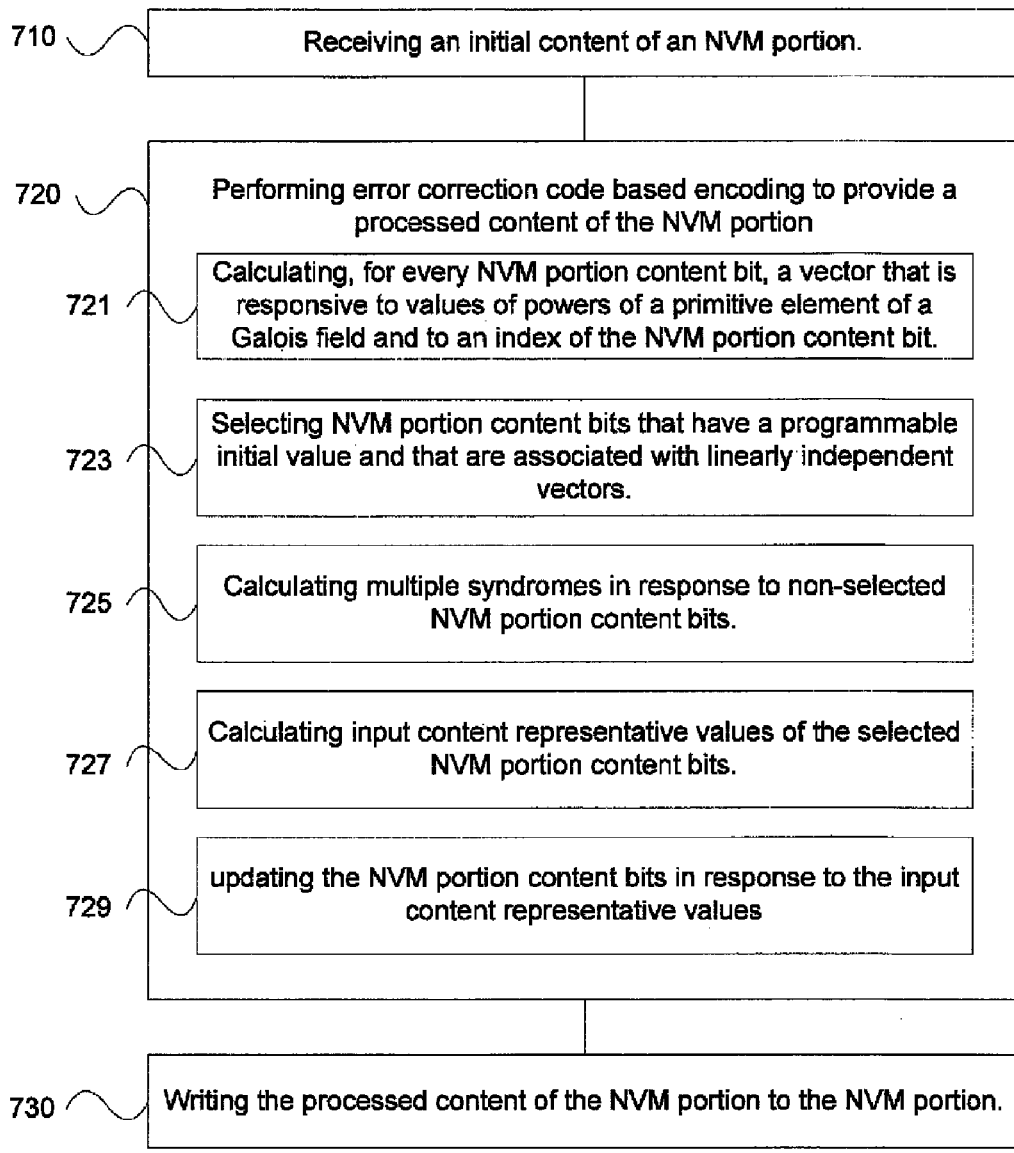
FIG. 7 illustrates a method for error correction code based encoding according to an embodiment of the invention.

FIG. 7 illustrates method 700 for error correction code based encoding according to an embodiment of the invention.

Method 700 starts by stage 710 of receiving an initial content of an NVM portion. The initial content differs from an erase content of the NVM portion. Stage 710 can include copying to a memory unit such as a RAM unit a content of a page of an NVM unit. The initial content is a result of one or more programming cycles that follow an erase operation. Accordingly, some NVM portion content bits are '0' while other NVM portion content bits are '1'.

Stage 710 is followed by stage 720 of performing error correction code based encoding to provide a processed content of the NVM portion. The error correction code based encoding is characterized by a write limitation that prevents a non-erase value of a bit to be changed to an erase value.

Stage 720 is followed by stage 730 of writing the processed content of the NVM portion to the NVM portion.

Stage 720 can include at least one of stages 721, 723, 725, 727 and 729.

Stage 721 includes calculating, for every NVM portion content bit, a vector that is responsive to values of powers of a primitive element of a Galois field and to an index of the NVM portion content bit.

Stage 723 includes selecting NVM portion content bits that have a programmable initial value and that are associated with linearly independent vectors.

Referring to stages 721 and 723, it is assumed that n is the number of NVM portion content bits, $m = \lceil \log_2(n+1) \rceil$ is the field size of the corresponding code, k is the number of bits to be error correction code based encoded. Stages 721 and 723 include calculating vectors v(i) and searching for indexes in the $i_2, i_2, \ldots, i_k$ such that $Y(i_j)=1$ and such that $$v(i_j) = \begin{pmatrix} \alpha^{i \cdot (2 \cdot 0 + 1)} \\ \vdots \\ \alpha^{i \cdot (2 \cdot \lceil k/m \rceil - 1)} \end{pmatrix}$$

are independent for j=1 ... k.

As long as n is sufficiently larger than k, it is possible to show that such selected NVM portion content bits can be found with high probability.

Stage 725 includes calculating multiple syndromes in response to non-selected NVM portion content bits.

Stage 725 can include calculating the syndromes according to the following equation:

$$S_j = \sum_{\substack{i \neq i_1, i_2, \ldots, i_{me} \\ i=1 \ldots n}} \alpha^{j(2i+1)}$$

for j=0 ... k' where $\lceil k/m \rceil - 1$

Stage 727 includes calculating input content representative values of the selected NVM portion content bits. The input content representative value can cause a decoder, when calculating syndromes during a decoding process, to output the input content.

Stage 727 can include setting a new bit vector Z=Y and recalculate the new values of the bits of Z(i1), Z(i2), ... Z(ik') which will nullify the (syndrome+input content) by computing $$(v(i_1) \ldots v(i_{k'}))^{-1}(S+M),$$

where S is the bit representation of $$\begin{pmatrix} S_0 \\ \vdots \\ S_{k'} \end{pmatrix}$$

and M is the bit representation of the input content.

Stage 729 includes updating the NVM portion content bits in response to the input content representative values.

A decoding process of the NVM content that was updated during method 700 can include reading the updated NVM portion content, calculating syndromes and extracting the input content.

If the reading process can introduce errors, then error correction techniques should be applied. This can involve allocating a further NVM portion for storing error correction information, and using that content to perform error correction information on an updated NVM portion content before performing error code based decoding. This can require an execution of methods 600 and 700.

The error correction method can utilize known error decoding algorithms. For example, applying a BCH decoder to find and correct errors. The decoding process can include: (i) calculating multiple syndromes of all programmable bits in all NVM portions and summing them up; (ii) Applying the Berlekamp-Massey algorithm to extract an error locator polynomial (ELP) from the syndromes; (iii) performing a Chien search (based on the ELP) to find and correct the erroneous bits.

Figure 8:
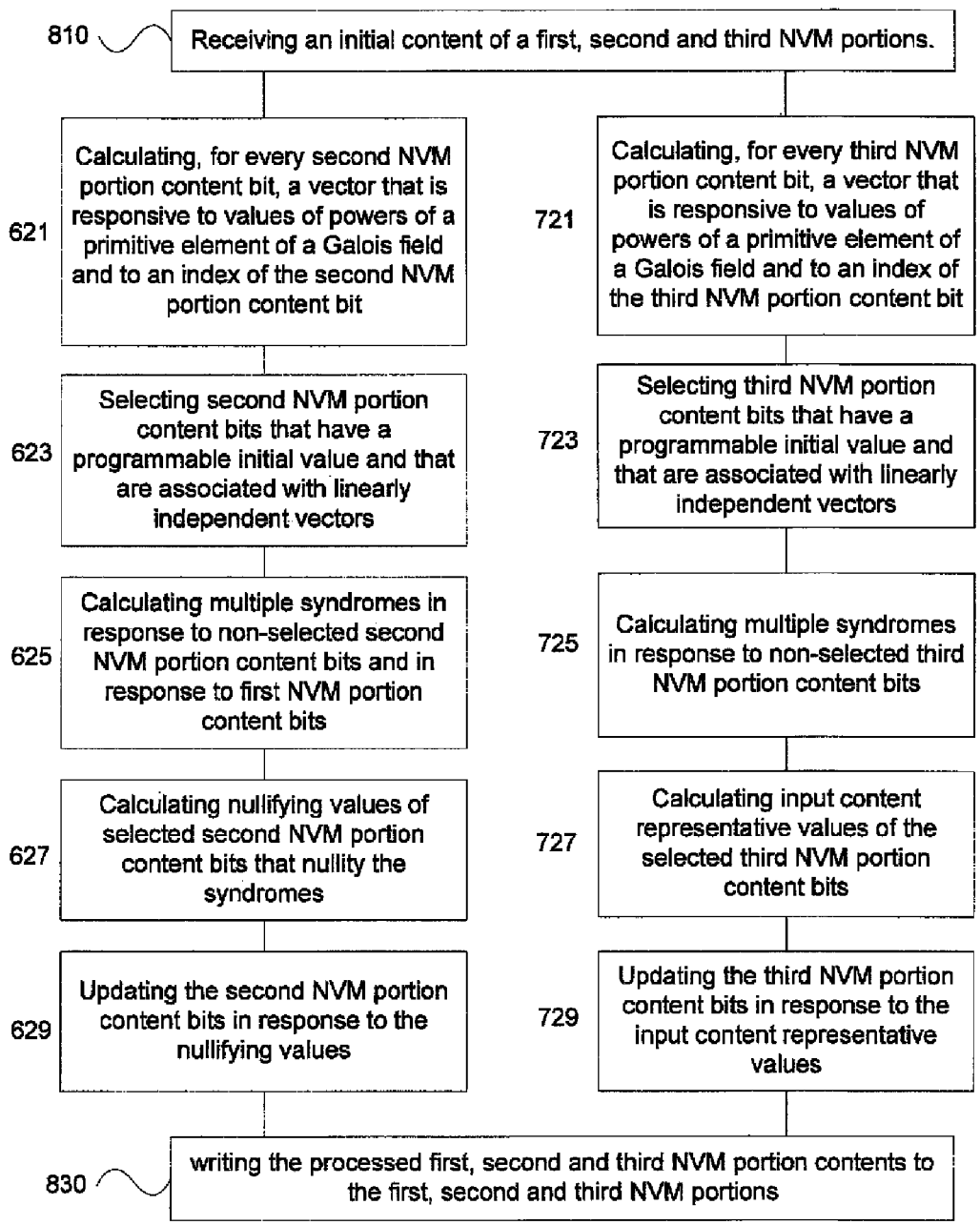
FIG. 8 illustrates a method for error code based encoding and generating error correction information according to an embodiment of the invention.

FIG. 8 illustrates method 800 for error code based encoding and generating error correction information according to an embodiment of the invention.

Method 800 includes generating error correction information for error correction of the content of a first NVM portion; writing the error correction information to a second NVM portion and error correction code based encoding of a content of a third NVM portion.

Method 800 starts by stage 810 of receiving an initial content of a first, second and third NVM portions. The first NVM portion content is protected by error correction information to be stored in the second NVM portion. The third NVM portion stored information to de decoded. Usually, the third NVM portion is much bigger than the first and second NVM portions.

Stage 810 is followed by stages 621-629 and 721-729.

Stages 621-629 include calculating, for every second NVM portion content bit, a vector that is responsive to values of powers of a primitive element of a Galois field and to an index of the second NVM portion content bit; selecting second NVM portion content bits that have a programmable initial value and that are associated with linearly independent vectors; calculating multiple syndromes in response to non-selected second NVM portion content bits and in response to first NVM portion content bits; calculating nullifying values of selected second NVM portion content bits that nullity the syndromes; updating the second NVM portion content bits in response to the nullifying values.

Stages 721-729 include: calculating, for every third NVM portion content bit, a vector that is responsive to values of powers of a primitive element of a Galois field and to an index of the third NVM portion content bit; selecting third NVM portion content bits that have a programmable initial value and that are associated with linearly independent vectors; calculating multiple syndromes in response to non-selected third NVM portion content bits; calculating input content representative values of the selected third NVM portion content bits; and updating the third NVM portion content bits in response to the input content representative values.

Stages 629 and 729 are followed by stage 830 of writing the processed first, second and third NVM portion contents to the first, second and third NVM portions.

According to another embodiment of the invention, method 800 includes writing a predefined content to the first NVM portion and then reading it, and performing error correction based upon differences between the read content and the predefined content. For example, a sequence of (e*m) NVM content bits can be set to zero and one read any deviation from the zero value indicates that error occurred.

If such error correction information is defined, then a probability of reprogramming failure, Pe, can be bound by the following expression:

$$\log Pe \leq \min_{\frac{\log 4}{3} > S > 0} \sum_{i=1}^{k'} \log(\psi_{L_i}(s)) - sn$$

where $$\psi_{L_i}(s) = \cfrac{1}{1 + \cfrac{1-e^s}{\frac{1}{2}e^s(1 - 2^{-(k+1-i)})}}$$

Thus, a k-long second NVM portion that stores error correction information can protect an n-bit long first NVM portion with a known error correction failure rate. For example, for n=1023, and k=360 the error correction failure rate is around 1E-19.

Either one of the encoding methods can be used for various purposes. In data cards, data which is written to a memory location which is currently programmed requires special care. Several methods of handling such an occurrence exist. The simplest method is just to copy the entire block to another location and modifying the relevant page on the way. However, this would cause long programming times and faster cycling of the blocks. Accordingly, the mentioned above reprogramming can be used to reprogram one of more pointer. Pointers can be used when content is slightly modified and the modified content portion is stored in anther location. The unmodified content can be stored near that pointer. The re-programming of pointers can be used to program to the relevant page a pointer to the actual physical page where the new data resides.

The decoding process that follows the encoding process can include: (i) calculating multiple syndromes of all programmable bits in all NVM portions (or in one or more relevant NVM portion) and summing them up; (ii) Applying the Berlekamp—Massey algorithm to extract an error locator polynomial (ELP) from the syndromes; (iii) performing a Chien search (based on the ELP) to find and correct the erroneous bits; (iv) Calculating multiple syndromes of all programmable bits in the corrected NVM portions and sum them up.

Figure 9:
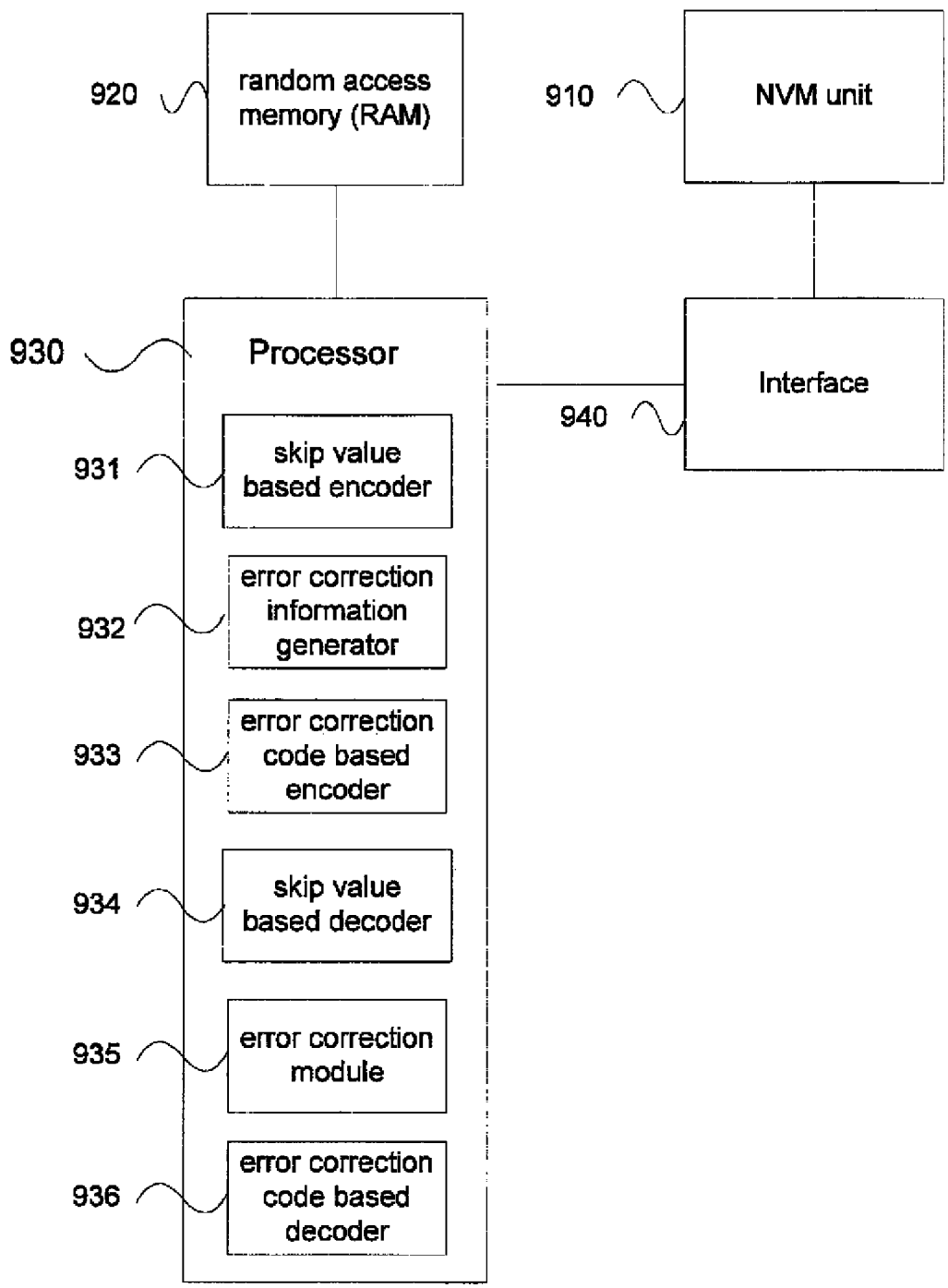
FIG. 9 illustrates a system according to an embodiment of the invention.

FIG. 9 illustrates a system 900 according to an embodiment of the invention. System 900 includes NVM unit 910, a random access memory (RAM) unit 920, for receiving an initial content of at least one NVM portion, wherein the initial content differs from an erase content of the NVM portion; processor 930 for generating processed NVM portion content, and interface 940 for writing the processed content of the NVM portion to the NVM portion.

System 900 can execute one or more of methods 100, 600, 700 and 800. It can perform at least one of the following (or a combination thereof): skip value based encoding, generating error correction information, error correction code based encoding, skip value based decoding, error correction based on error correction information, and error correction code based decoding.

Processor 930 can include at least one of skip value based encoder 931, error correction information generator 932, error correction code based encoder 933; skip value based decoder 934, error correction module 935, error correction code based decoder 936.

Skip value based encoder 931 can divide the initial content to multi-bit groups; and change multiple bits of the initial content so that each multi-bit group has a group value that is responsive to initial values of the bits of the multi-bit group, the write limitation and the input content; wherein the group values are selected from a skip value and at least one data value.

Error correction information generator 932 can generate error correction information for error correction of a content of a first NVM portion and wherein the NVM unit stores the error correction information in a second NVM portion. Error correction information generator 932 can calculate, for every second NVM portion content bit, a vector that is responsive to values of powers of a primitive element of a Galois field and to an index of the second NVM portion content bit; select second NVM portion content bits that have a programmable initial value and that are associated with linearly independent vectors; calculate multiple syndromes in response to non-selected second NVM portion content bits and in response to first NVM portion content bits; calculate nullifying values of selected second NVM portion content bits that nullify the syndromes; and update the second NVM portion content bits in response to the nullifying values.

Error correction code based encoder 933 can calculate, for every NVM portion content bit, a vector that is responsive to values of powers of a primitive element of a Galois field and to an index of the NVM portion content bit; select NVM portion content bits that have a programmable initial value and that are associated with linearly independent vectors; calculate multiple syndromes in response to non-selected NVM portion content bits; calculate input content representative values of the selected NVM portion content bits; and update the NVM portion content bits in response to the input content representative values.

It is noted that these various modules can share one or more sub-module such as a syndrome calculating module, a vector v(i) calculating module, a nullifying value calculating module, a linearly independent vector finder module and the like.

Each module can include software, hardware, firmware, middleware or a combination thereof.

The processor and RAM unit can belong to a memory controller unit, but this is not necessarily so.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

In the claims, the word 'comprising' does not exclude the presence of other elements or steps from those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

I claim:

1. A method for reprogramming a non volatile memory (NVM) portion, the method comprising: receiving an initial content of an NVM portion; the initial content of the NVM portion having a result of at least one programming cycle that follows an erase cycle, the initial content differing from an erase content of the NVM portion; processing the initial content in response to input content, wherein the processing is characterized by a write limitation that prevents a non-erase value of a hit to he changed to an erase value, wherein the processing comprises at least one out of (a) skip value based encoding, (b) generating error correction information and (c) error correction code based encoding; and writing the processed content of the NVM portion to the NVM portion thereby re-programming the NVM portion without erasing the NVM portion.

2. The method according to claim 1 wherein the NVM portion is an NVM page.

3. The method according to claim 1 wherein the processing comprises skip value based encoding and generating error correction information.

4. The method according to claim 1 wherein the skip value based encoding comprises: dividing the initial content to multi-bit groups; and changing multiple bits of the initial content so that each multi-bit group has a group value that is responsive to initial values of the bits of the multi-bit group, the write limitation and the input content; wherein the group values are selected from a skip value and at least one data value.

5. The method according to claim 4 comprising searching, for each input content bit that has an erase value, for a multi-bit group that comprises only bits that their initial value equals an erase value.

6. The method according to claim 5 wherein the searching comprises writing a skip value to a multi-bit group that was evaluated during the searching and comprises at least one bit that has an initial value that differs from an erase value.

7. The method according to claim 4 wherein the multi-bit group comprises a pair of bits.

8. The method according to claim 4 wherein the multi-hit group comprises at least three bits.

9. The method according to claim 1 comprising generating error correction information for error correction of a content of a first NVM portion and storing the error correction information in a second NVM portion.

10. The method according to claim 9 wherein the generating of error correction information comprises: receiving an initial content of the second NVM portion: calculating, for every second NVM portion content bit, a vector that is responsive to values of powers of a primitive element of a Galois field and to an index of the second NVM portion content bit; selecting second NVM portion content bits that have a programmable initial value and that are associated with linearly independent vectors; calculating multiple syndromes in response to non-selected second NVM portion content bits and in response to first NVM portion content bits; calculating nullifying values of selected second NVM portion content bits that nullity the syndromes: and updating the second NVM portion content hits in response to the nullifying values.

11. The method according to claim 9 wherein the first NVM portion and the second NVM portion belong to a single NVM page.

12. The method according to claim 1 wherein the error correction code based encoding comprises: receiving an initial content of the NVM portion; calculating, for every NVM portion content bit, a vector that is responsive to values of powers of a primitive element of a Galois field and to an index of the NVM portion content bit: selecting NVM portion content bits that have a programmable initial value and that are associated with linearly independent vectors: calculating multiple syndromes in response to non-selected NVM portion content bits; calculating input content representative values of the selected NVM portion content bits: and updating the NVM portion content bits in response to the input content representative values.

13. The method according to claim 11 wherein the input content representative value causes a decoder, when calculating syndromes, to output the input content.

14. The method according to claim 11 further comprising writing a predetermined sequence to another NVM portion in order to enable a decoder that reads the other NVM portion to perform error correction based upon the predetermined sequence.

15. The method according to claim 1 wherein the processing comprises generating error correction information and error correction code based encoding.

16. The method according to claim 15 comprising: generating error correction information for error correction of a content of a first NVM portion: writing the error correction information to a second NVM portion and error correction code based encoding of a content of a third NVM portion.

17. The method according to claim 16 comprising: receiving an initial content of the second NVM portion; calculating, for every second NVM portion content bit, a vector that is responsive to values of powers of a primitive element of a Galois field and to an index of the second NVM portion content bit; selecting second NVM portion content bits that have a programmable initial value and that are associated with linearly independent vectors;
calculating multiple syndromes in response to non-selected second NVM portion content bits and in response to first NVM portion content bits; calculating nullifying values of selected second NVM portion content bits that nullity the syndromes; and updating the second NVM portion content bits in response to the nullifying values.

18. The method according to claim 16 comprising: receiving an initial content of the third NVM portion; calculating, for every third NVM portion content bit, a vector that is responsive to values of powers of a primitive element of a Galois field and to an index of the third NVM portion content bit; selecting third NVM portion content bits that have a programmable initial value and that are associated with linearly independent vectors;
calculating multiple syndromes in response to non-selected third NVM portion content bits; calculating input content representative values of the selected third NVM portion content bits:
and updating the third NVM portion content bits in response to the input content representative values.

19. A system that has non volatile memory (NVM) portion reprogramming capabilities, the system comprises: an NVM unit; a random access memory (RAM) unit for receiving an initial content of an NVM portion; wherein the initial content of the NVM portion is a result of at least one programming cycle that follows an erase cycle wherein the initial content differs from an erase content of the NVM portion: a processor for processing the initial content in response to input content; wherein the processing is characterized by a write limitation that prevents a non-erase value of a bit to be changed to an erase value; wherein the processing comprises at least one out or (a) a skip value based encoder, (b) error correction information generator and (c) error correction code based encoder; and an interface for writing the processed content of the NVM portion to the NVM portion thereby reprogramming the NVM portion without erasing the NVM portion.

20. The system according to claim 19 wherein the NVM portion is an NVM page.

21. The system according to claim 19 wherein the processor comprises the skip value based encoder and the error correction information generator.

22. The system according to claim 19 wherein the skip value based encoder is configured to divide the initial content to multi-bit groups: and to change multiple bits of the initial content so that each multi-bit group has a group value that is responsive to initial values of the bits of the multi-bit group, the write limitation and the input content: wherein the group values are selected from a skip value and at least one data value.

23. The system according to claim 22 wherein the skip value based encoder is configured to search, for each input content bit that has an erase value, a multi-bit group that comprises only bits that their initial value equals an erase value.

24. The system according to claim 23 wherein the skip value based encoder is configured to write a skip value to a multi-bit group that was evaluated during the searching and comprises at least one bit that has an initial value that differs from an erase value.

25. The system according to claim 22 wherein the multi-bit group comprises a pair of bits.

26. The system according to claim 22 wherein the multi-bit group comprises at least three bits.

27. The system according to claim 19 wherein the error correction information generator is configured to generate error correction information for error correction of a content of a first NVM portion and wherein the NVM unit stores the error correction information in a second NVM portion.

28. The system according to claim 27 wherein the RAM unit is configured to receive an initial content of the second NVM portion: and the error correction information generator is configured to: calculate, for every second NVM portion content bit, a vector that is responsive to values of powers of a primitive element of a Galois field and to an index of the second NVM portion content bit: select second NVM portion content bits that have a programmable initial value and that are associated with linearly independent vectors;

calculate multiple syndromes in response to non-selected second NVM portion content bits and in response to first NVM portion content bits: calculate nullifying values of selected second NVM portion content bits that nullity the syndromes; and update the second NVM portion content bits in response to the nullifying values.

29. The system according to claim 27 wherein the first NVM portion and the second NVM portion belong to a single NVM page.

30. The system according to claim 19 wherein the error correction code based encoder is configured to: receive an initial content of the NVM portion; calculate, for every NVM portion content bit, a vector that is responsive to values of powers of a primitive element of a Galois field and to an index of the NVM portion content bit: select NVM portion content bits that have a programmable initial value and that are associated with linearly independent vectors; calculate multiple syndromes in response to non-selected NVM portion content bits; calculate input content representative values of the selected NVM portion content bits; and update the NVM portion content bits in response to the input content representative values.

31. The system according to claim 30 wherein the input content representative value causes a decoder, when calculating syndromes, to output the input content.

32. The system according to claim 30 wherein another NVM portion is configured to store a predetermined sequence in order to enable a decoder that reads the other NVM portion to perform error correction based upon the predetermined sequence.

33. The system according to claim 19 wherein the processor comprises the error correction information generator and the error correction code based encoder.

34. The system according to claim 33 wherein the error correction information generator generates error correction information for error correction of a content of a first NVM portion; a second NVM portion stores the error correction information and a third NVM portion stores an output of the error correction code based encoder.

35. The system according to claim 34 wherein the RAM unit is configured to receive an initial content of the second NVM portion; wherein the error correction information generator is configured to: calculate, for every second NVM portion content bit, a vector that is responsive to values of powers of a primitive element of a Galois field and to an index of the second NVM portion content bit; select second NVM portion content bits that have a programmable initial value and that are associated with linearly independent vectors:

calculate multiple syndromes in response to non-selected second NVM portion content bits and in response to first NVM portion content bits; calculate nullifying values of selected second NVM portion content bits that nullity the syndromes; and update the second NVM portion content bits in response to the nullifying values.

36. The system according to claim 34 wherein the RAM unit receives an initial content of the third NVM portion; wherein the error correction code based encoder is configured to: calculate, for every third NVM portion content bit, a vector that is responsive to values of powers of a primitive element of a Galois field and to an index of the third NVM portion content bit; select third NVM portion content bits that have a programmable initial value and that are associated with linearly independent vectors; calculate multiple syndromes in response to non-selected third NVM portion content bits; calculate input content representative values of the selected third NVM portion content bits; and update the third NVM portion content bits in response to the input content representative values.

* * * * *